(12) United States Patent
Yuan

(10) Patent No.: US 9,182,266 B2
(45) Date of Patent: Nov. 10, 2015

(54) LIQUID LEVEL DETECTORS

(71) Applicant: Fisher Controls International LLC, Marshalltown, IA (US)

(72) Inventor: Bob Yuan, Shenzhen (CN)

(73) Assignee: FISHER CONTROLS INTERNATIONAL LLC, Marshalltown, IA (US)

(*) Notice: Subject to any disclaimer, the term of this patent is extended or adjusted under 35 U.S.C. 154(b) by 26 days.

(21) Appl. No.: 14/011,037

(22) Filed: Aug. 27, 2013

(65) Prior Publication Data

US 2014/0062461 A1    Mar. 6, 2014

(30) Foreign Application Priority Data

Aug. 30, 2012 (CN) .......................... 2012 2 0450391

(51) Int. Cl.
*A61M 5/00* (2006.01)
*G05D 7/00* (2006.01)
*G01F 23/26* (2006.01)
*G01F 23/38* (2006.01)

(52) U.S. Cl.
CPC ................ *G01F 23/26* (2013.01); *G01F 23/38* (2013.01)

(58) Field of Classification Search
CPC ............ A61M 5/16886; A61M 5/172; A61M 2209/045; G05D 7/0676
USPC ..................................... 324/204; 73/317, 313
See application file for complete search history.

(56) References Cited

U.S. PATENT DOCUMENTS

| 4,974,625 | A | | 12/1990 | Paullus et al. | |
| 5,083,461 | A | | 1/1992 | Winkler | |
| 5,117,693 | A | * | 6/1992 | Duksa | ............................. 73/317 |
| 5,267,580 | A | * | 12/1993 | Payzant | ..................... 134/57 D |
| 2006/0288777 | A1 | * | 12/2006 | Lazaris | ........................... 73/313 |
| 2011/0005312 | A1 | * | 1/2011 | Hopper | ........................... 73/313 |

FOREIGN PATENT DOCUMENTS

| CN | 2249422 | | 3/1997 |
| CN | 2847507 | Y * | 12/2005 |
| CN | 1741222 | | 3/2006 |
| CN | 2847507 | | 12/2006 |
| CN | 201222722 | | 4/2009 |

(Continued)

OTHER PUBLICATIONS

International Searching Authority, "International Search Report", issued in connection with PCT Application No. PCT/CN2013/082178, mailed on Nov. 21, 2013, 9 pages.

(Continued)

*Primary Examiner* — Paresh Patel
*Assistant Examiner* — Akm Zakaria
(74) *Attorney, Agent, or Firm* — Hanley, Flight & Zimmerman, LLC

(57) ABSTRACT

Liquid level detectors are described. An example liquid level detector includes a housing and an arm extending through the housing. A lever assembly is coupled to the arm and the housing, and movement of the arm causes the lever assembly to open or close a switch via a magnetic field when a liquid reaches a predetermined level.

16 Claims, 2 Drawing Sheets

(56) References Cited

FOREIGN PATENT DOCUMENTS

| | | | |
|---|---|---|---|
| CN | 101604168 | | 12/2009 |
| CN | 101769779 A | * | 12/2009 |
| CN | 101769779 | | 7/2010 |
| CN | 201893289 U | * | 12/2010 |
| CN | 202929493 | | 5/2013 |
| DE | 2627865 A1 | * | 6/1976 |
| DE | 2627865 | | 1/1978 |
| DE | 3907489 A1 | * | 3/1989 |
| DE | 19751210 A1 | * | 11/1997 |

OTHER PUBLICATIONS

International Searching Authority, "Written Opinion", issued in connection with PCT Application No. PCT/CN2013/082178, mailed on Nov. 21, 2013, 7 pages.

International Searching Authority, "International Preliminary Report on Patentability," issued in connection with PCT Application No. PCT/CN2013/082178, issued on Mar. 3, 2015, 9 pages.

* cited by examiner

LIQUID LEVEL DETECTORS

RELATED APPLICATIONS

This patent claims priority from Chinese Patent Application Number 201220450391.3, entitled "Liquid Level Detectors, which was filed on Aug. 30, 2012 and is hereby incorporated by reference herein in its entirety.

FIELD OF THE DISCLOSURE

This disclosure relates generally to liquid level control devices and, more particularly, to liquid level detectors.

BACKGROUND

During natural gas extraction, a mixture of liquids and gases is pumped into a separator, which separates the liquids from the gases. The liquid level in the separator must be detected and controlled. If the liquid drops below a certain level in the separator, gases may enter storage tanks intended solely for liquids, and if the liquid exceeds a certain level in the separator, liquids may enter piping intended solely for gases. Thus, detecting and controlling the liquid level in a separator is critical to the proper operation of the separator.

Traditionally, liquid level detectors used during natural gas extraction are powered by the pressure of the natural gases being extracted from the well site. These pneumatic liquid level detectors cause natural gas that would otherwise be sold to vent into the atmosphere. Also, the reliability of pneumatic liquid level detectors decreases when particulates are present in the gas and/or when the gas contains moisture.

SUMMARY

An example liquid level detector includes a housing and an arm extending through the housing. A plurality of operatively coupled levers is disposed in the housing. A first one of the levers is operatively coupled to the arm and a second one of the levers is operatively coupled to the first lever. Movement of the arm moves the first lever to cause the second lever to open or close a switch without contacting the switch when a liquid reaches a predetermined level.

Another example liquid level detector includes a housing and an arm extending through the housing. A lever assembly is coupled to the arm and the housing, and movement of the arm causes the lever assembly to open or close a switch via a magnetic field when a liquid reaches a predetermined level.

Another disclosed example liquid level detector includes means for amplifying a movement of means for displacing a liquid. The means for amplifying has means for actuating a switch without contacting the switch when the liquid reaches a predetermined level.

DETAILED DESCRIPTION

Figure 1:
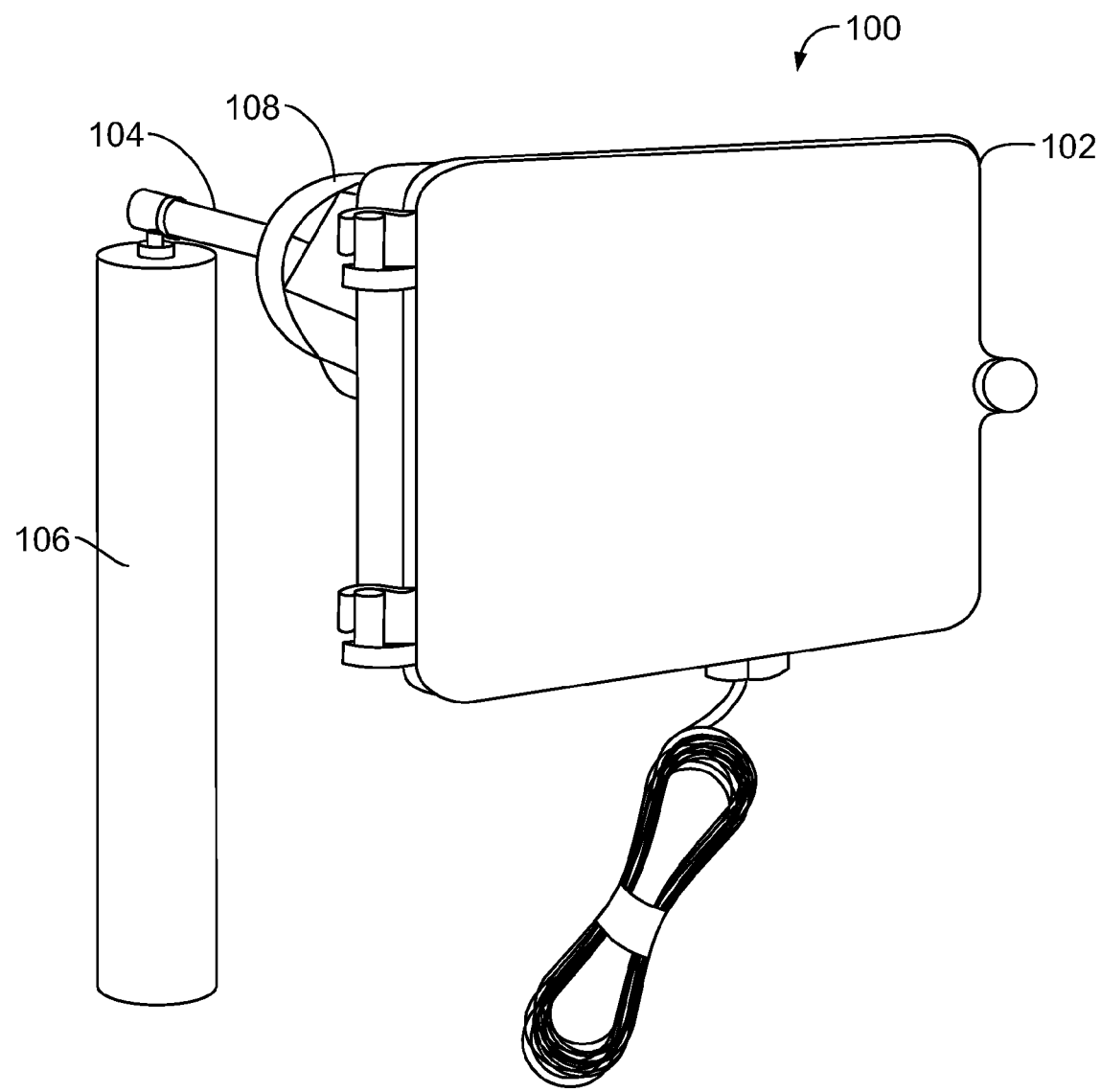
FIG. 1 depicts an example liquid level detector.

While the following example liquid level detectors are described in conjunction with natural gas well sites, the example liquid level detectors described herein may also be used to control liquid levels for any other application.

Natural gas is extracted from subterranean formations in a mixture of gases, liquids, and mud. Separators are often used to separate the natural gas from the mixture extracted from the formations. A separator is a tank with separate chambers (e.g., collection chambers) for liquids and gases. In many instances, the separator enables liquids to collect at the bottom of the separator in a liquid collection chamber and enables gases to collect at the top of the separator in a gas collection chamber. Once separated, the liquids and gases are piped to separate storage tanks.

A dump valve in a liquid collection chamber is typically controlled to maintain the liquid between predetermined upper and lower levels. If the liquid drops below the predetermined lower level, gases may enter the liquid piping and vent out of the liquid storage tanks, possibly resulting in environmental hazards and government fines. If the liquid rises above the predetermined upper level, liquids may enter the gas piping, potentially blocking or harming the piping. Therefore, maintaining the liquid between the predetermined levels in the liquid collection chamber by controlling the dump valve is an important aspect of operating a separator at a natural gas well site.

Liquid level detectors are often used to send instructions (e.g., a signal) to a controller that the liquid has reached a predetermined level. If the liquid reaches a predetermined upper level, the controller may instruct an actuator to open a dump valve, which releases liquid from the liquid collection chamber to lower the liquid level. If the liquid reaches a predetermined lower level, the controller may instruct the actuator to close the dump valve. Traditionally, liquid level detectors used during the extraction of natural gases are pneumatically powered by the pressure of the natural gases extracted from the well site. In operation, a pneumatic liquid level detector delivers a pneumatic output signal to an actuator, which vents the natural gas into the atmosphere, thereby wasting natural gas that would otherwise be sold. Also, the reliability of pneumatic liquid level detectors decreases when the particulates are present in the gas and/or when the gas contains moisture.

The example liquid level detectors described herein do not require pneumatic or electrical power. In general, example liquid level detectors described herein open or close a switch (e.g., a TopWorx® GO Switch, which is a leverless limit switch, or a switch including an inductive proximity sensor) when a liquid reaches a predetermined level. An example liquid level detector described herein includes a housing and an arm extending through the housing. The arm may be coupled to a displacer that is at least partially submerged in liquid or fully submerged at the interface of two liquids of different specific gravities. In operation, the displacer moves in response to a change in the liquid level, and the movement of the displacer moves the arm. A lever assembly is coupled to the arm and the housing. Movement of the arm causes the lever assembly to open and close a switch without contacting the switch via a magnetic field when the liquid reaches a predetermined level.

An example lever assembly may include a first lever and a second lever. The first lever is operatively coupled to the arm and the second lever. Movement of the arm moves the first lever to cause the second lever to open or close the switch without contacting the switch via the magnetic field when the liquid reaches a predetermined level. The switch may be wired directly to an actuator coupled to a dump valve so that when the switch is closed, the switch signals the actuator to open or close the dump valve. Thus, the example liquid level detectors described herein may be used to maintain a liquid between predetermined levels.

The example liquid level detectors described herein do not require pneumatic power and do not cause natural gas to vent into the atmosphere. Further, the reliability of the liquid level detectors described herein is not affected by the quality of the natural gas extracted from the well site, and the liquid level detectors described herein do not require electrical power to actuate a switch.

FIG. 1 depicts an example liquid level detector 100, which includes a housing 102 and an arm 104 extending through the housing 102. A displacer 106 is coupled to the arm 104 and, in use, may be at least partially submerged in a liquid or fully submerged between two liquids of different specific gravities. The arm 104 is disposed within a trunnion 108, which enables the arm 104 to pivot when the displacer 106 moves in response to a change in the liquid level. As described in greater detail below, movement of the arm 104 causes a lever assembly 200 (FIG. 2) disposed in the housing 102 to open or close a switch 202 (FIG. 2) without contacting the switch 202 (e.g., via a magnetic field) when the liquid reaches a predetermined level.

Figure 2:
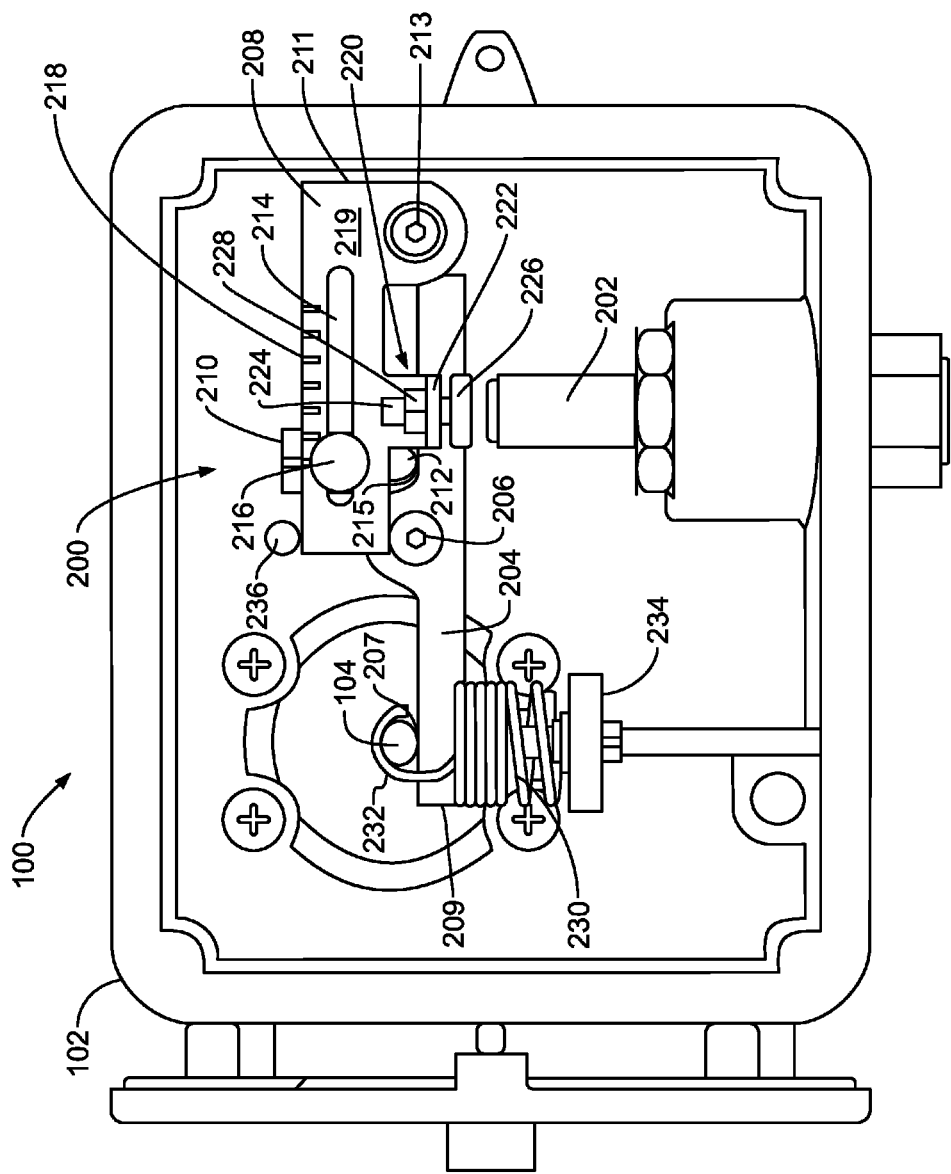
FIG. 2 depicts an example lever assembly that may be used to implement the example liquid level detector of FIG. 1.

FIG. 2 depicts the example lever assembly 200 that may be used to implement the example liquid level detector 100 of FIG. 1. A midpoint of a first lever 204 is pivotably coupled to a first shoulder screw 206 mounted to the housing 102, and an upper surface or edge 207 adjacent to an end 209 of the first lever 204 contacts the arm 104. An end 211 of a second lever 208 is also pivotably coupled to the housing 102 via a second shoulder screw 213. A linkage 210 having a curved tip 212 is adjustably coupled to the second lever 208 to contact an upper surface 215 of the first lever 204 to enable the second lever 208 to move in response to the movement of the first lever 204. The second lever 208 also defines an elongated aperture 214. A fastener 216 (e.g., a bolt, knob, or any suitable fastener) is inserted through the aperture 214 to thread into the linkage 210 to secure the linkage 210 to the second lever 208. The linkage 210 may be moved along the aperture 214 to contact the first lever 204 at different positions along the first lever 204 to change the amount the second lever 208 moves in response to a given amount of movement of the first arm 204. Markings or graduations 218 are provided above the aperture 214 on a face 219 of the second lever 208 to provide a visual reference for the position of the linkage 210 along the aperture 214. As discussed in greater detail below, adjusting the position of the linkage 210 changes the sensitivity of the lever assembly 200 to the movement of the arm 104, thus affecting the liquid level at which the second lever 208 opens or closes the switch 202.

The second lever 208 also includes a trigger 220 to open or close the switch 202. The trigger 220 is adjustably coupled to a lip 222 extending perpendicularly from the face 219 of the second lever 208. The trigger 220 includes a threaded rod 224 extending from a ferrous head 226. The lip 222 defines an aperture (not shown) to receive the threaded rod 224 of the trigger 220. A locknut 228 is threaded onto the threaded rod 224 and tightened against the lip 222 to secure the trigger 220 to the lip 222 such that the ferrous head 226 of the trigger 220 is disposed beneath the lip 222. The switch 202 (e.g., a Top-Worx® GO Switch, which is a leverless limit switch, or a switch including an inductive proximity sensor) is disposed in the housing 102 beneath the head 226 of the trigger 220 in the orientation of FIG. 2. The trigger 220 may be moved toward or away from the switch 202 by adjusting the position of the locknut 228 on the threaded rod 224 of the trigger 220. The switch 202 provides a magnetic field, which creates attractive forces between the ferrous head 226 of the trigger 220 and the switch 202. As described in greater detail below, adjusting the distance between the head 226 of the trigger 220 and the switch 202 changes the liquid level differential needed to move the arm 104.

Also shown in FIG. 2, the arm 104 is coupled to a spring 230 via a hook 232 extending from the coil of the spring 230. The hook 232 rests in a circumferential groove (not shown) on the arm 104, thereby biasing the arm 104 downward in the orientation of FIG. 2. The spring 230 does not contact the first lever 204. The spring 230 biases the arm 104 downward in the orientation of FIG. 2 to apply a force to the first lever 204 to oppose the attractive forces between the switch 202 and the head 226 of the trigger 220 and maintain a gap between the head 226 of the trigger 220 and the switch 202. The spring 230 is coupled to an adjustable spring seat 234 to adjust a preload of the spring 230. As described in greater detail below, the preload of the spring 230 also affects the liquid level differential needed to move the arm 104.

A stop 236 is disposed above the second lever 208 to limit the upward movement of the second lever 208, and the shoulder screw 206 supporting the first lever 204 is disposed below the second lever 208 to limit the downward movement of the second lever 208. Thus, the positions of the stop 236 and the shoulder screw 206 affect the maximum and minimum size of the gap, respectively, between the head 226 of the trigger 220 and the switch 202 during the operation of the example liquid level detector 100. As described in greater detail below, the trigger 220 actuates the switch 202 without contacting the switch via a magnetic field when the head 226 of the trigger 220 moves closer to or farther away from the switch 202.

Generally, in operation, the displacer 106 moves in response to a change in the liquid level and causes the arm 104 to move. The movement of the arm 104 causes the lever assembly 200 to open or close the switch 202 via a magnetic field when the liquid reaches a predetermined level. Thus, no physical contact between the lever assembly 200 and the switch 202 is needed to actuate the switch 202.

More specifically, the geometry of the arm 104 and the lever assembly 200 amplify the movement of the displacer 106 and convey that movement to the trigger 220 to open or close the switch 202. For example, a rise in the liquid level increases the buoyant force on the displacer 106, which causes the end of the arm 104 disposed outside the housing 102 to move upward when the force on the arm 104 overcomes the attractive forces between the trigger 220 and the switch 202. As a result, the end of the arm 104 disposed inside the housing 102 moves downward in the orientation of FIG. 2. The downward movement of the end of the arm 104 disposed inside the housing 102 causes the first lever 204 to move in a counterclockwise direction in the view depicted in FIG. 2. The counterclockwise movement of the first lever 204 causes the second lever 208 to rotate in a clockwise direction. The position of the linkage 210 along the aperture 214 determines the amount of rotation of the second lever 208 relative to the amount of rotation of the first lever 204. In the orientation of FIG. 2, the trigger 220 moves away from the switch 202 as the second lever 208 rotates in a clockwise direction.

In the example shown in FIG. 2, the switch 202 may be wired to be in a normally open position and to actuate to a closed position when the trigger 220 moves away from the switch 202. Thus, when the liquid reaches the predetermined upper level and the trigger 220 has moved a certain distance away from the switch 202, the attractive forces between the trigger 220 and the switch 202 cause the switch 202 to actuate to the closed position, thereby sending a signal to an actuator (not shown) to open a dump valve (not shown) to lower the liquid level. Once the switch 202 is in the closed position, the magnetic field provided by the switch 202 prevents the switch 202 from resetting until the liquid returns to a level below the predetermined upper level. If the liquid continues to rise beyond the predetermined upper level, the second lever 208 engages the stop 236, which limits the further movement of the second lever 208.

The example liquid level detectors described herein do not use electrical power to actuate the switch 202. Also, the example liquid level detectors described herein do not utilize pneumatic power and, thus, are not affected by the quality of the natural gases extracted from the well sites. In addition, the example liquid level detectors described herein do not cause wasteful natural gas venting.

The sensitivity of the lever assembly 200 to the movement of the arm 104 may be adjusted by moving the linkage 210 along the aperture 214 to contact the first lever 204 at different positions along the first lever 204. The position of the linkage 210 affects the movement of the trigger 220 relative to the amplification of the movement of the displacer 106 by determining the rotation of the second lever 208 relative to the rotation of the first lever 204. Consequently, the liquid level differential required to actuate the switch 202 can be increased by moving the linkage 210 towards the arm 104 and decreased by moving the linkage 210 away from the arm 104, thereby making the example liquid level detector 100 less sensitive or more sensitive, respectively, to changes in the liquid level and changing the predetermined level.

The sensitivity of the arm 104 to changes in the liquid level is also adjustable. The magnitude of the movement of the arm 104 in response to a change in the liquid level is affected by two preoperative conditions: the preload of the spring 230 and the distance between the trigger 220 and the switch 202. First, the preload of the spring 230 may be adjusted by raising or lowering the adjustable spring seat 234. The force of the spring 208 on the arm 104 enables the arm 104 overcome the attractive forces between the trigger 220 and the switch 202. Thus, increasing the preload of the spring 230 lessens the liquid level differential needed to move the end of the arm 104 disposed outside the housing 102 upward in the orientation of FIG. 2.

Second, the distance between the trigger 220 and the switch 202 may be adjusted by repositioning the locknut 228 on the threaded rod 224 of the trigger 220, thus moving the trigger 220 closer to or farther from the switch 202. When the trigger 220 is moved closer to the switch 202, the magnitude of the movement of the arm 104 in response to a change in the liquid level decreases because the arm 104 must overcome a greater attractive force between the trigger 220 and the switch 202 to cause the first lever 204 to move the second lever 208. Conversely, the magnitude of the movement of the arm 104 in response to a change in the liquid level will increase when the trigger 220 is moved farther away from the switch 202.

Although certain example apparatus have been described herein, the scope of coverage of this patent is not limited thereto. On the contrary, this patent covers all apparatus fairly falling within the scope of the claims of this patent.

What is claimed is:

1. A liquid level detector, comprising:
   a housing;
   an arm extending through the housing; and
   a plurality of operatively coupled levers disposed in the housing, wherein a first one of the levers is operatively coupled to the arm and a second one of the levers is operatively coupled to the first lever, and
   a linkage to operatively couple the first lever and the second lever, the linkage being adjustably coupled to the second lever to enable the linkage to contact the first lever at different positions along the first lever,
   wherein movement of the arm moves the first lever to cause the second lever to open or close a switch without contacting the switch when a liquid reaches a predetermined level.

2. The liquid level detector of claim 1, wherein the first one of the levers
   moves in a first rotational direction and the second one of the levers moves in a second rotational direction opposite the first rotational direction.

3. The liquid level detector as defined in claim 1, wherein the position of the linkage relative to the second lever affects the predetermined level.

4. The liquid level detector as defined in claim 3, wherein the second lever defines an elongated aperture through which the linkage is adjustably coupled, and wherein the linkage may be moved to different positions along the elongated aperture of the second lever to contact the first lever at different positions along the first lever.

5. The liquid level detector as defined in claim 3, further comprising a spring biasing the arm.

6. The liquid level detector as defined in claim 5, wherein the spring is
   coupled to an adjustable spring seat to adjust a preload of the spring, and wherein the preload of the spring affects a magnitude of a movement of the arm in response to a change in the liquid level.

7. The liquid level detector as defined in claim 1, further comprising a stop to limit movement of the second lever.

8. The liquid level detector as defined in claim 1, wherein the second lever includes a ferrous material to open or close the switch.

9. The liquid level detector as defined in claim 8, wherein the switch is a leverless limit switch.

10. The liquid level detector as defined in claim 8, wherein the switch comprises an inductive proximity sensor.

11. A liquid level detector, comprising:
    a housing;
    an arm extending through the housing;
    a lever assembly coupled to the housing and including a first lever and a second lever, wherein the first lever is coupled to the arm, wherein movement of the arm causes the first lever to cause the second lever to open or close a switch via a magnetic field when a liquid reaches a predetermined level, and a spring to bias the movement of the arm, wherein the spring is coupled to an adjustable spring seat to adjust a preload of the spring, wherein the preload of the spring affects a magnitude of a movement of the arm in response to a change in the liquid level.

12. A liquid level detector as defined in claim 11, wherein the arm is to be coupled to a displacer positioned outside the housing.

13. The liquid level detector as defined in claim 11, wherein the second lever includes a ferrous material to open or close the switch.

14. The liquid level detector as defined in claim 13, wherein the switch is a leverless limit switch.

15. The liquid level detector as defined in claim 13, wherein the switch comprises an inductive proximity sensor.

16. The liquid level detector as defined in claim 8, wherein a distance between the ferrous material of the second lever and the switch is adjustable, wherein the distance affects a magnitude of movement of the arm in response to a change in the liquid level.

* * * * *